(12) United States Patent
Yonemochi et al.

(10) Patent No.: US 6,339,261 B1
(45) Date of Patent: Jan. 15, 2002

(54) SEMICONDUCTOR DEVICE AND PROCESS OF PRODUCING SAME

(75) Inventors: Masahiro Yonemochi, Nagano; Toshiyuki Motooka, Kawasaki; Hideharu Sakoda, Kawasaki; Muneharu Morioka, Kawasaki; Mamoru Suwa, Kawasaki, all of (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/531,273

(22) Filed: Mar. 20, 2000

(30) Foreign Application Priority Data

Apr. 6, 1999 (JP) .............................................. 11-098786

(51) Int. Cl.[7] ........................ H01L 23/48; H01L 23/52; H01L 29/40
(52) U.S. Cl. ...................... 257/784; 257/724; 257/773; 257/787; 257/127; 257/578
(58) Field of Search ................................ 257/780, 730, 257/787, 784, 781, 773, 786, 774; 438/112, 126, 127, 578

(56) References Cited

U.S. PATENT DOCUMENTS 5,157,475 A * 10/1992 Yamaguchi
5,214,308 A * 5/1993 Nishiguchi et al.
5,278,446 A * 1/1994 Nagaraj et al.
5,900,676 A * 5/1999 Kweon et al.
6,001,671 A * 12/1999 Fjestad
6,072,239 A * 6/2000 Yoneda et al.
6,080,932 A * 6/2000 Smith et al.
6,198,171 B1 * 3/2001 Huang et al.

FOREIGN PATENT DOCUMENTS

| EP | 0773584 | 5/1997 |
| JP | A-9-162348 | 6/1997 |

* cited by examiner

*Primary Examiner*—Sheila V. Clark
(74) *Attorney, Agent, or Firm*—Pennie & Edmonds LLP

(57) ABSTRACT

A semiconductor device which comprises a semiconductor chip packaged in a resin package and having an electrode terminal wire-bonded to a conductor cap having one end defining an exposed top of an external connection terminal protruding from the resin package and the other end defining an orifice embedded in the resin package, wherein the orifice of the conductor cap has a radially outward extending flange which anchors the conductor cap to the resin package. The process of producing the semiconductor device is also disclosed.

3 Claims, 6 Drawing Sheets

Fig.4(a)
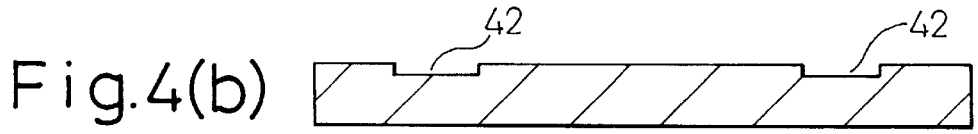
Fig.4(b)
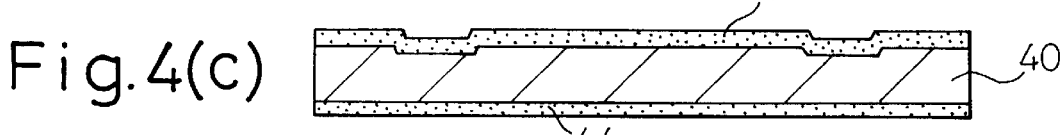
Fig.4(c)
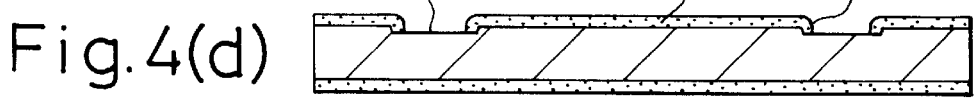
Fig.4(d)
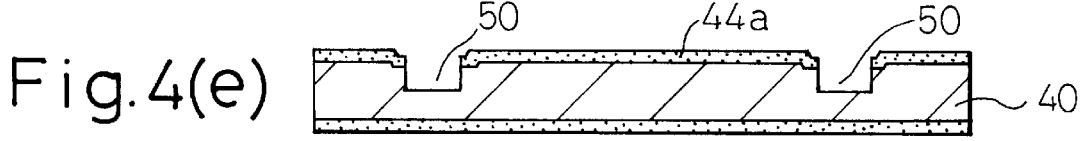
Fig.4(e)
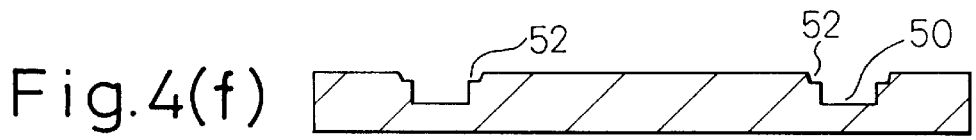
Fig.4(f)
Fig.4(g)
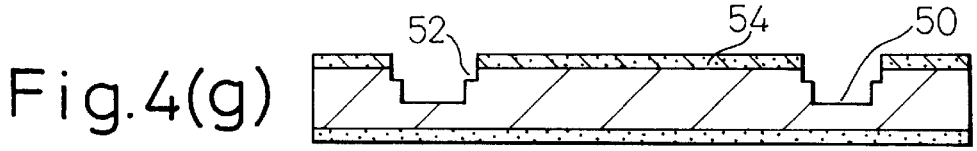
Fig.4(h)
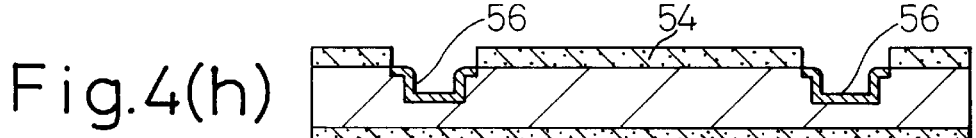
Fig.4(i)
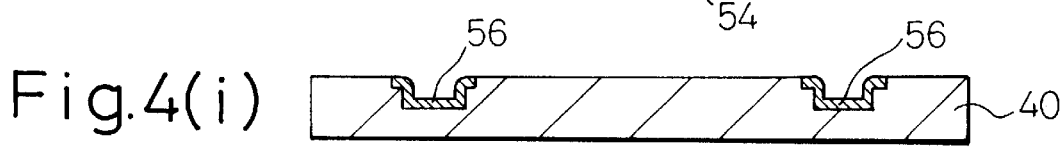
Fig.4(j)
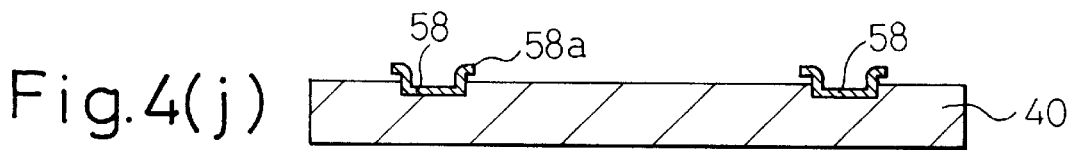

SEMICONDUCTOR DEVICE AND PROCESS OF PRODUCING SAME

BACKGROUND OF THE INVENTION

1. Field of the Invention

The present invention relates to a semiconductor device including a semiconductor chip embedded or packaged in a resin package having resin bumps protruding therefrom to form external connection terminals provided with a metal film thereon.

2. Description of the Related Art

FIG. 1 is a cross-sectional view of a conventional semiconductor device including a semiconductor chip 10 embedded or packaged in a resin package 12 having resin bumps 16 protruding therefrom to form external connection terminals 14 provided with a metal film 18 formed thereon by plating. A bonding wire 20 electrically connects an electrode terminal of the semiconductor chip 10 and the metal film 18 for external electrical connection. A resin cover 22 protects the back side of the semiconductor chip 10 by preventing the chip 10 from being exposed to the air.

FIG. 2 is a bottom view of the semiconductor device of FIG. 1 and shows the external connection terminals 14 surrounding the semiconductor chip 10.

The shown structure is advantageous because the electrode terminal of the semiconductor chip 10 is directly connected to the metal film 18 of the external connection terminal 14 through the bonding wire 20 and requires no space for further wiring between the external connection terminal and the bonding wire, which facilitates miniaturization of semiconductor devices.

FIGS. 3(a) to 3(e) are cross-sectional views showing the process of producing the semiconductor device shown in FIGS. 1 and 2.

Referring to FIG. 3(a), a photoresist is applied onto a metal base 30 such as a copper foil, followed by exposure to light and development to form a resist pattern 32 having windows or openings at positions for forming external connection terminals 14 (FIG. 1).

In the next step shown in FIG. 3(b), the metal base 30 is etched using the resist pattern 32 as an etching mask to form recesses 34 in the metal base 30.

As shown in FIG. 3(c), the metal base 30 is subject to plating to form a metal film 18 on the bottom and side wall of the recesses 34 to provide a conductor cap of an external connection terminal to be connected to a semiconductor chip by wire bonding.

In FIG. 3(d), a semiconductor chip 10 is bonded to, and mounted on, the metal base 30 in a predetermined position with a protective resin 22 and electrode terminals of the semiconductor chip 10 are wire-bonded to the metal films 18 within the recesses 34.

In FIG. 3(e), resin packaging is then carried out so that the semiconductor chip 10, the bonding wire and the metal film 18 are embedded in a resin package 12. The portion of the resin filling the recess 34 forms a resin bump having a height of about 0.3 mm, for example. The recess 34 has a depth corresponding to the height of the resin bump.

The metal base 30 is finally removed by solving or etching to complete the semiconductor device shown in FIG. 1. The metal film 18 must be composed of a metal or metal alloy which is not solved during etching of the metal base to provide an external connection terminal composed of a resin bump having a conductor cap 18 protruding from the rear surface of the resin package 12.

Instead of removal by solving or etching, the metal base 30 can be otherwise removed by exfoliating the base metal 30 from the resin package 10 to complete the semiconductor device shown in FIG. 1.

As can be seen from FIGS. 3(c) and 3(d), the conductor cap or metal film 18 has an open end (or an upper end) which protrudes from the metal base 30 at a height of the thickness of the resist pattern 32 and enters a short length the resin package 12 to provide holding of the metal film 18 by the resin package 12 in addition to adhesion of the metal film 18 to the resin bump 16 (FIG. 1).

However, the conventional semiconductor device has a problem because the metal film 18 is occasionally exfoliated from the resin bump 16 when adhesion therebetween is weak.

SUMMARY OF THE INVENTION

The object of the present invention is to provide a semiconductor device including a semiconductor chip embedded or packaged in a resin package having resin bumps protruding therefrom to form external connection terminals provided with a metal film formed thereon, in which the metal film is prevented from undesirably exfoliated from the resin bumps thereby providing improved reliability of the semiconductor device.

To achieve the object according to the first aspect of the present invention, there is provided a semiconductor device which comprises a semiconductor chip packaged in a resin package and having an electrode terminal wire-bonded to a conductor cap having one end defining an exposed top of an external connection terminal protruding from the resin package and the other end defining an orifice embedded in the resin package, wherein:

the orifice of the conductor cap has a radially outward extending flange which anchors the conductor cap to the resin package.

According to the second aspect of the present invention, there is also provided a process of producing a semiconductor device, the process comprising the steps of:

forming in one side of a metal base a recess having a stepped orifice with a diameter greater than that of the other portion of the recess;

forming a metal film covering an inner surface of the recess including the stepped orifice so that the metal film forms a conductor cap having an orifice provided with a radially outward extending flange defined by the stepped orifice of the recess;

etching the metal base to partially expose the conductor cap from the metal base so that the flange of the conductor cap is apart from the metal base with a gap therebetween while the conductor cap in a portion other than the flange remains embedded in the metal base;

mounting a semiconductor chip on the metal base with a resin layer intervening therebetween;

wire-bonding an electrode terminal of the semiconductor chip to an inner surface of the conductor cap with a bonding wire;

packaging the semiconductor chip, the bonding wire and the conductor cap with a packaging resin so that the packaging resin fills the conductor cap to form a resin bump and fills the gap between the flange of the conductor cap and the metal base to cause the flange to anchor the conductor cap to the packaging resin; and removing the metal base by solving to form an external connection terminal protruding from the packaging resin, the external connection terminal being composed of the resin bump having a top covered with the conductor cap having the flange embedded in the packaging resin.

According to the third aspect of the present invention, there is further provided a process of producing a semiconductor device, the process comprising the steps of:

forming a recess in one side of a metal base;

forming a plating mask on said one side of the metal base, the plating mask having a window through which the recess is exposed and which has a diameter greater than that of the recess so that the window defines a surrounding area of a surface of the metal base that either entirely or partially surrounds an open end of the recess;

forming a metal film covering an inner surface of the recess and the surrounding area so that the metal film forms a conductor cap having a radially outward extending flange defined by the surrounding area;

etching the metal base to partially expose the conductor cap from the metal base so that the flange of the conductor cap is apart from the metal base with a gap therebetween while the conductor cap in a portion other than the flange is embedded in the metal base;

mounting a semiconductor chip on the metal base with a resin layer intervening therebetween;

wire-bonding an electrode terminal of the semiconductor chip to an inner surface of the conductor cap with a bonding wire;

packaging the semiconductor chip, the bonding wire and the conductor cap with a packaging resin so that the packaging resin fills the conductor cap to form a resin bump and fills the gap between the flange of the conductor cap and the metal base to cause the flange to anchor the conductor cap to the packaging resin; and removing the metal base by solving to form an external connection terminal protruding from the packaging resin, the external connection terminal being composed of the resin bump having a top covered with the conductor cap having the flange embedded in the packaging resin.

BRIEF DESCRIPTION OF THE DRAWINGS

FIGS. 4(a) to 4(j) are cross-sectional views showing process steps of producing a semiconductor device according to a preferred embodiment of the present invention;

DESCRIPTION OF THE PREFERRED EMBODIMENTS

Figure 1:
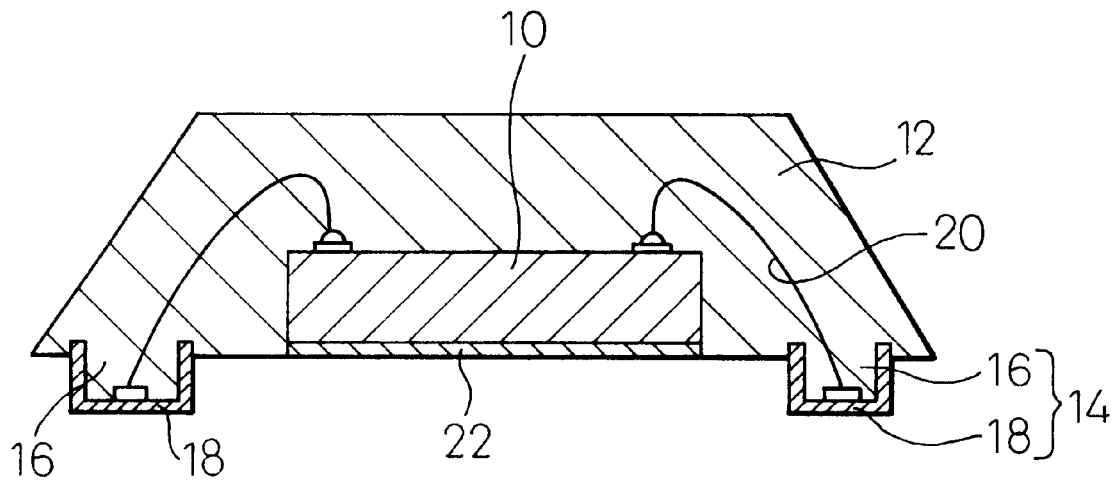
FIG. 1 is a cross-sectional view of a conventional semiconductor device including a semiconductor chip embedded or packaged in a resin package having resin bumps protruding therefrom to form external connection terminals.
Figure 2:
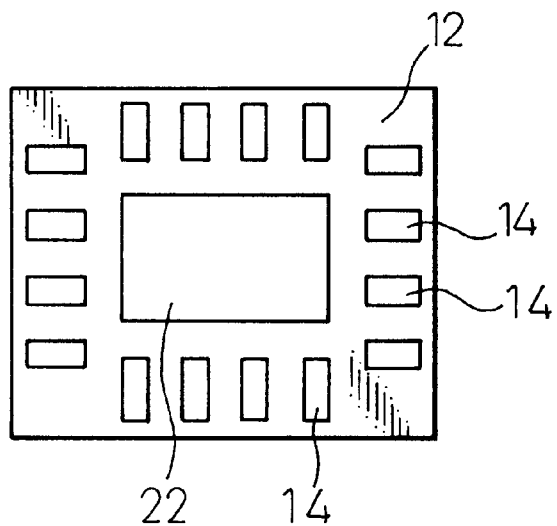
FIG. 2 is a bottom view of the semiconductor device of FIG. 1.
Figure 3A:
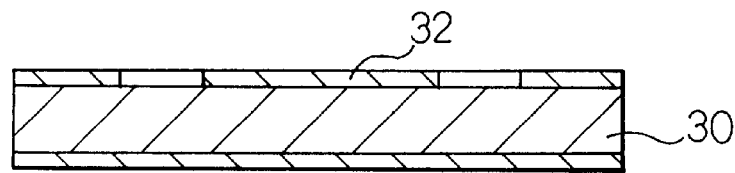
FIGS. 3(a) to 3(e) are cross-sectional views showing the process of producing the semiconductor device shown in FIGS. 1 and 2.
Figure 3B:
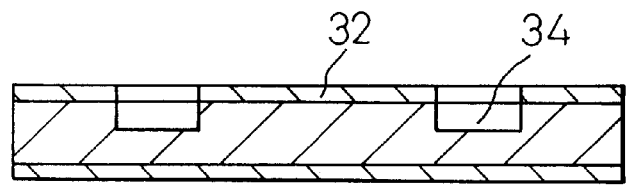
Figure 3C:
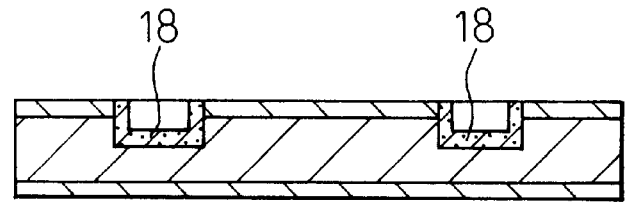
Figure 3D:
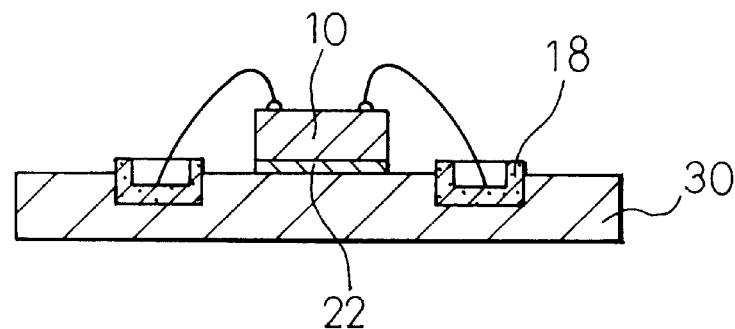
Figure 3E:
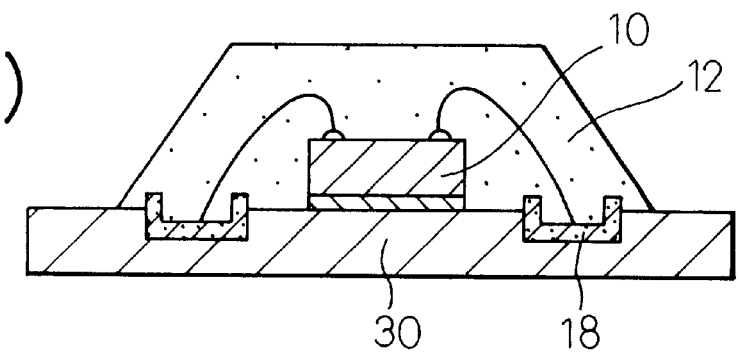

FIGS. 4(a) to 4(j) are cross-sectional views showing process steps of producing a semiconductor device according to a preferred embodiment of the present invention.

FIG. 4(a) shows a metal base 40 for temporarily mounting thereon a semiconductor chip. After a semiconductor chip is mounted and resin-packaged, the metal base 40 is removed by solving or etching in the conventional manner. Therefore, the metal base 40 must consist of a metal or a metal alloy which can be easily solved.

In FIG. 4(b), the metal base 40 is worked by coining to form a first recess 42 on one side thereof in the positions for forming external connection terminals. The first recess 42 is in a shallow dish form for defining a flange of the open end of a conductor cap of an external connection terminal, and therefore, has a depth corresponding to the thickness of the metal film forming the conductor cap, for example, about 0.01 mm. The first recess 42 may be otherwise formed by etching, although coining is most advantageous when the recess is very shallow or about 0.01 mm deep.

Referring to FIG. 4(c), the metal base 40 is covered with a photoresist layer 44 on both sides.

Referring to FIG. 4(d), the resist layer 44 on the side including the first recess 42 is patterned by exposure to light and development to form a resist pattern 44a having a window or opening through which the bottom of the first recess 42 is exposed. The resist pattern 44a in a portion 44b covers the side wall of the first recess 42, and also, the peripheral portion of the bottom of the first recess 42 by the thickness of the resist pattern 44a.

In FIG. 4(e), the metal base 40 is etched using the resist pattern 44a as an etching mask to form a second recess 50 by further digging the first recess 42 in the core portion surrounded by the resist pattern 44b. The second recess 50 has a dimension corresponding to that of the resin bump 16.

In FIG. 4(f), the resist pattern 44a, including the portion 44b, is removed by solution to reveal the recess 50 having a stepped orifice 52 defined by the difference between a greater diameter of the first recess 42 and a smaller diameter of the second recess 50.

In FIG. 4(g), a photoresist is applied onto the metal base 40 and is patterned by exposure to light and development to form a plating resist pattern 54 having an opening through which the recess 50 including the stepped orifice 52 is exposed.

In FIG. 4(h), the metal base 40 is electrolytically plated using the resist pattern 54 as a plating mask to form a metal film 56 on the bottom and side wall of the recess 50 including the stepped orifice 52. The metal film 56 may be composed of either a single layer or plural layers, in which the single layer or at least the outermost layer must be insoluble with an etchant solution during etching of the metal base 40 in the later step. The "outermost layer" means a layer formed directly on the inner surface of the recess. For example, the metal film 56 is composed of an outermost layer of paradium, an intermediate layer of nickel and an innermost layer of gold, in which the paradium is insoluble with an etchant for etching the metal base 40 of copper and also has good solderability, the nickel facilitates bonding of the paradium on the platinum, and the platinum has good wire-bondability and durability. The metal film 56 may be otherwise composed of an outermost layer of gold, a first intermediate layer of paradium, a second intermediate layer of nickel and an innermost layer of paradium.

In FIG. 4(i), the resist pattern 54 is removed by solving to leave the metal film 56 which coats the inner surface of the recesses 50 including the stepped orifice.

In FIG. 4(j), the metal base 40 is reduced in thickness by etching with an etching solution containing ferric chloride until the level of the upper surface of the metal base 40 is lowered to provide a conductor cap 58 composed of the metal film 56, in which the cap 58 has an exposed upper half having an orifice flange 58a apart from the upper surface of the metal base 40 and a lower half embedded in the metal base 40.

During the etching, the metal base 40 is reduced in thickness by about 0.05 mm. The materials of the metal base 40 and the metal film 56 and the etchant for etching the metal base 40 are suitably selected or combined so that the etchant essentially etches the metal base 40 only and does not etch the metal film 56.

The etching may etch the metal base 40 either on both sides or on the side having the metal film 56.

The metal base 40 must have a strength or a thickness sufficient to temporarily carry a semiconductor chip after being thinned by etching and, therefore, must have an original thickness determined by considering the reduction in thickness by the etching. Usually, a metal base 40 composed of a copper foil may advantageously be about 0.15 mm thick.

Figure 5:
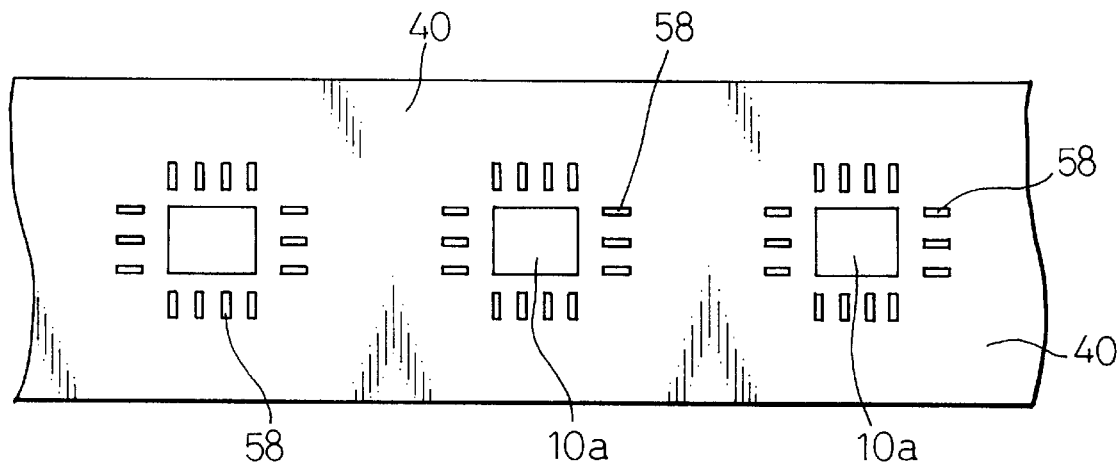
FIG. 5 is a plan view of the metal base having the conductor caps prepared through the process steps of FIGS. 4(a)–4(j)

FIG. 5 is a plan view of the metal base 40 having the conductor caps 58 prepared through the above-described process steps of FIGS. 4(a)–4(j). The metal base 40 is in the form of a strip in which mounting areas 10a for mounting a semiconductor chip 10 thereon are disposed at intervals along the length direction of the strip and each of the mounting areas 10a is surrounded by the conductor caps 58. The metal base 40 may be in a form other than a strip.

Figure 6A:
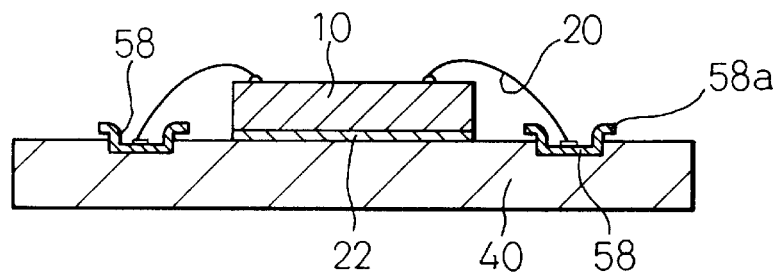
FIGS. 6(a) and 6(b) are cross-sectional views showing the further process steps of producing a semiconductor device using the metal base having the conductor caps formed thereon according to the present invention.
Figure 6B:
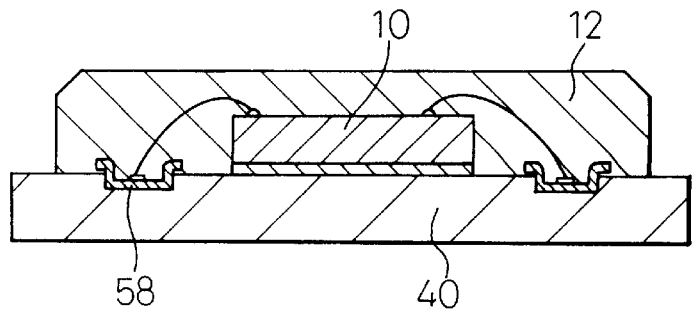

FIGS. 6(a) and 6(b) are cross-sectional views showing the further process steps of producing a semiconductor device using the metal base 40 having the conductor caps 58 formed thereon, in which the process steps are basically the same as those conventionally used.

In FIG. 6(a), a semiconductor chip 10 is mounted on the metal base 40 in the mounting area 10a with a protective resin 22 interposed therebetween, and then electrode terminals of the semiconductor chip 10 are wire-bonded to the bottom surface of the conductor caps 58 with a bonding wire 20. The conductor cap 58 has an orifice in the form of a radially outward extending flange 58a. The bottom of the conductor cap 58 advantageously is elongated to facilitate motion of a bonding tool during wire bonding.

In FIG. 6(b), resin packaging is then carried out so that the semiconductor chip 10, the bonding wire 20 and the conductor cap 58 are embedded in a resin package 12 on one side of the metal base 40. The packaging resin fills the space within the conductor cap 58 to form a resin bump 16 while filling a gap between the flange 58a of the cap 58 and the upper surface of the metal base 40 so that the flange 58a anchors the conductor cap 58 in the resin package 12 to prevent exfoliation of the conductor cap 58 even when adhesion of the cap or plated metal coating 58 to the resin bump 16 is very weak. The flange may have any form which ensures anchoring of the cap 58 in the resin package 12. For example, a flange 58a may be either entirely or partially provided along the periphery of the orifice of a cap 58.

Figure 7:
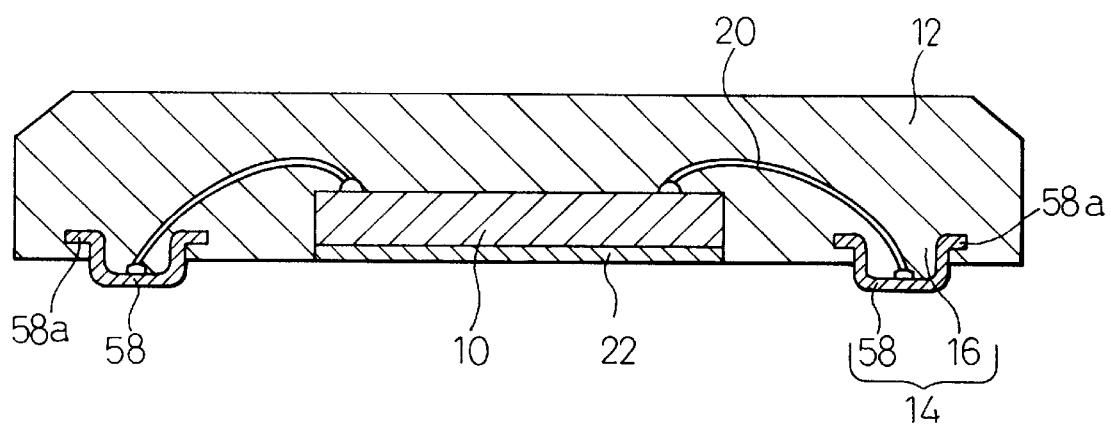
FIG. 7 is a cross-sectional view showing a semiconductor device according to the present invention.

In the final step shown in FIG. 7, the metal base 40 is removed by solving or etching to complete a semiconductor device including a resin-packaged semiconductor chip 10 according to the present invention. The semiconductor device has an external connection terminal 14 composed of the resin bump 16 and the conductor cap 58 covering the resin bump 16 and having an orifice flange 58a embedded in the resin package 12, so that the conductor cap 58 is anchored to the packaging resin 12 by the flange 58a to prevent the cap 58 from exfoliating from the resin bump 16.

FIGS. 8(a) to 8(g) are cross-sectional views showing process steps of producing a semiconductor device according to another preferred embodiment of the present invention, in which a conductor cap 58 of external connection terminals of a semiconductor device is formed in a metal base 40 by etching only.

Figure 8A:
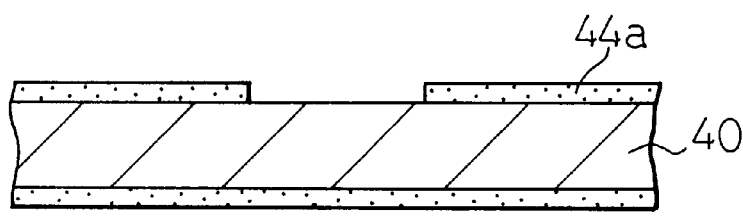
FIGS. 8(a) to 8(g) are cross-sectional views showing process steps of producing a semiconductor device according to another preferred embodiment of the present invention.

In FIG. 8(a), a photoresist is applied to both sides of a metal base 40, and on one side, is patterned to form a resist pattern 44a having a window or opening through which the upper surface of the metal base 40 is exposed.

Figure 8B:
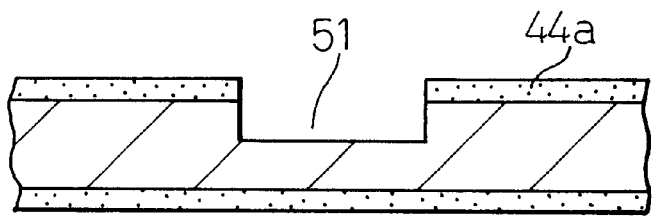

In FIG. 8(b), the metal base 40 is etched using the resist pattern 44a as an etching mask to form a recess 51 in the metal base 40.

Figure 8C:
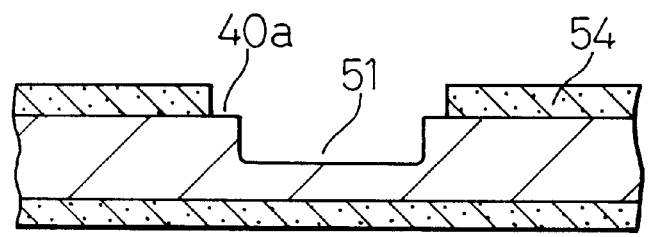

In FIG. 8(c), after the resist pattern 44a is removed, a plating resist pattern 54 is formed on the metal base 40. The plating resist pattern 54 has a window or opening greater in diameter than the recess 51 so that the recess 51 and the upper surface of the metal base 40 in the surrounding area 40a surrounding the open end of the recess 51 are exposed through the window.

Figure 8D:
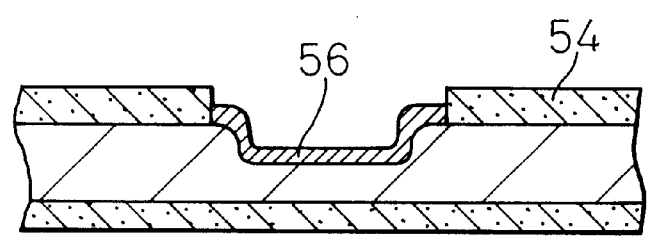

In FIG. 8(d), the metal base 40 is electrolytically plated using the resist pattern 54 as a plating mask to form a metal film 56 which covers the inner surface of the recess 51 and the surrounding area 40a of the upper surface of the metal base 40.

Figure 8E:
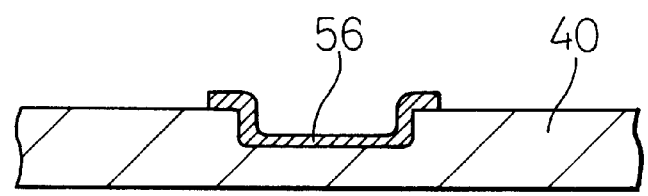

In FIG. 8(e), the plating resist pattern 54 is removed to expose the metal base 40 on both sides, leaving the metal film 56 unremoved.

Figure 8F:
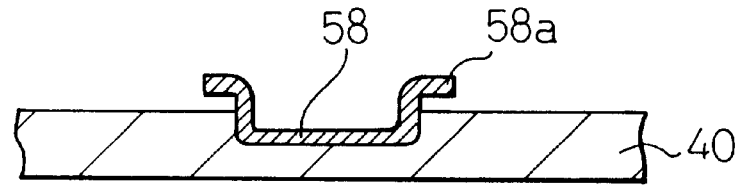

In FIG. 8(f), the metal base 40 is thinned by etching until the level of the upper surface of the metal base 40 is lowered to provide a conductor cap 58 composed of the metal film 56, in which the cap 58 has an orifice flange 58a apart from the upper surface of the metal base 40 and a bottom embedded in the metal base 40.

The materials of the metal base 40 and the plated metal layer 56 and the etchant for etching the metal base 40 are suitably selected or combined so that the etchant essentially etches the metal base 40 only and does not etch the plated metal layer 56.

The orifice flange 58a is positioned at a level which can be adjusted by varying the time for which the metal base 40 is etched. For example, FIG. 8(g) shows a conductor cap 58 produced by etching the metal base 40 for a longer time and having an orifice flange 58a positioned at a higher level than that shown in FIG. 8(f), in which the conductor cap 58 is supported by the metal base 40 substantially by the bottom alone.

The conductor caps 58 are formed in the necessary number at the necessary positions, although a single conductor cap 58 is described with reference to FIGS. 8(a) to 8(g).

In this embodiment, a semiconductor device as shown in FIG. 7 is also produced by using the metal base 40 having the conductor cap 58, through the same process as described above with reference to FIGS. 6(a) and 6(b). Namely, as shown in FIG. 6(a), the process includes mounting a semiconductor chip 10 on the metal base 40 in the mounting area 10a with a protective resin 22 interposed therebetween, and then wire-bonding electrode terminals of the semiconductor chip 10 to the bottom of the conductor caps 58 with a bonding wire 20, and as shown in FIG. 6(b), followed by conducting resin packaging so that the semiconductor chip 10, the bonding wire 20 and the conductor cap 58 are embedded in a resin package 12 on one side of the metal base 40. The packaging resin fills the space within the conductor cap 58 to form a resin bump 16 while filling a gap between the flange 58a of the cap 58 and the upper surface of the metal base 40 so that the flange 58a anchors the conductor cap 58 in the resin package 12 to prevent exfoliation of the conductor cap 58 even when adhesion of the cap or plated metal coating 58 and the resin bump 16 is very weak.

Figure 8G:
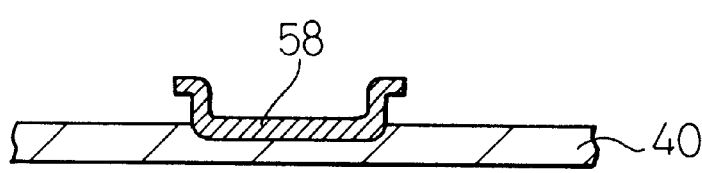

When the conductor cap 58 has an orifice flange 58a positioned at a higher level as shown in FIG. 8(g), the substantial portion of the conductor cap 58 is embedded in the packaging resin 12, and in an extreme case, the resin bump 16 has a very small height so that the semiconductor device has a substantially flat mounting surface.

As described herein above, the present invention provides a semiconductor device having an external connection terminal provided with a conductor cap with an open end embedded in a resin package, the open end having an orifice flange which anchors the cap to the resin package and prevents the cap from exfoliating from the resin package, thereby ensuring an improved reliability in performance and handling.

What is claimed is:

1. A semiconductor device which comprises a semiconductor chip packaged in a resin package and having an electrode terminal wire-bonded to a conductor cap having one end defining an exposed top of an external connection terminal protruding from the resin package and the other end defining an orifice embedded in the resin package, wherein:
   the orifice of the conductor cap has a radially outward extending flange which anchors the conductor cap to the resin package.

2. A process of producing a semiconductor device, the process comprising the steps of:
   forming in one side of a metal base a recess having a stepped orifice with a diameter greater than that of the other portion of the recess;
   forming a metal film covering an inner surface of the recess including the stepped orifice so that the metal film forms a conductor cap having an orifice provided with a radially outward extending flange defined by the stepped orifice of the recess;
   etching the metal base to partially expose the conductor cap from the metal base so that the flange of the conductor cap is apart from the metal base with a gap therebetween while the conductor cap in a portion other than the flange remains embedded in the metal base;
   mounting a semiconductor chip on the metal base with a resin layer intervening therebetween;
   wire-bonding an electrode terminal of the semiconductor chip to an inner surface of the conductor cap with a bonding wire;
   packaging the semiconductor chip, the bonding wire and the conductor cap with a packaging resin so that the packaging resin fills the conductor cap to form a resin bump and fills the gap between the flange of the conductor cap and the metal base to cause the flange to anchor the conductor cap to the packaging resin; and
   removing the metal base by solving to form an external connection terminal protruding from the packaging resin, the external connection terminal being composed of the resin bump having a top covered with the conductor cap having the flange embedded in the packaging resin.

3. A process of producing a semiconductor device, the process comprising the steps of:
   forming a recess in one side of a metal base;
   forming a plating mask on said one side of the metal base, the plating mask having a window through which the recess is exposed and which has a diameter greater than that of the recess so that the window defines a surrounding area of a surface of the metal base that either entirely or partially surrounds an open end of the recess;
   forming a metal film covering an inner surface of the recess and the surrounding area so that the metal film forms a conductor cap having a radially outward extending flange defined by the surrounding area;
   etching the metal base to partially expose the conductor cap from the metal base so that the flange of the conductor cap is apart from the metal base with a gap therebetween while the conductor cap in a portion other than the flange is embedded in the metal base;
   mounting a semiconductor chip on the metal base with a resin layer intervening therebetween;
   wire-bonding an electrode terminal of the semiconductor chip to an inner surface of the conductor cap with a bonding wire;
   packaging the semiconductor chip, the bonding wire and the conductor cap with a packaging resin so that the packaging resin fills the conductor cap to form a resin bump and fills the gap between the flange of the conductor cap and the metal base to cause the flange to anchor the conductor cap to the packaging resin; and
   removing the metal base by solving to form an external connection terminal protruding from the packaging resin, the external connection terminal being composed of the resin bump having a top covered with the conductor cap having the flange embedded in the packaging resin.

* * * * *

UNITED STATES PATENT AND TRADEMARK OFFICE
CERTIFICATE OF CORRECTION

PATENT NO.    : 6,339,261 B1
DATED         : January 15, 2002
INVENTOR(S)   : Masahiro Yonemochi et al.

It is certified that error appears in the above-identified patent and that said Letters Patent is hereby corrected as shown below:

<u>Title page,</u>
Item [73], should read as follows:
-- [73]   Assignee:   Shinko Electric Industries Co.. Ltd., Nagano, Japan
and
Fujitsu Limited, Kanagawa, Japan --

Signed and Sealed this

Twelfth Day of November, 2002

*Attest:*

*Attesting Officer*

JAMES E. ROGAN
*Director of the United States Patent and Trademark Office*